United States Patent
Lee

(10) Patent No.: US 8,101,452 B2
(45) Date of Patent: *Jan. 24, 2012

(54) IMAGE SENSOR AND METHOD FOR MANUFACTURING THE SAME

(75) Inventor: Kang Hyun Lee, Yongin-Si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 705 days.

This patent is subject to a terminal disclaimer.

(21) Appl. No.: 12/143,961

(22) Filed: Jun. 23, 2008

(65) Prior Publication Data

US 2008/0315341 A1 Dec. 25, 2008

(30) Foreign Application Priority Data

Jun. 25, 2007 (KR) .................. 10-2007-0062014

(51) Int. Cl.
*H01L 31/0203* (2006.01)
(52) U.S. Cl. ........ 438/70; 438/69; 438/82; 257/E31.127
(58) Field of Classification Search .................. 438/70, 438/57, 69, 82; 257/294, E31.127
See application file for complete search history.

(56) References Cited

U.S. PATENT DOCUMENTS

| 5,384,231 | A * | 1/1995 | Johnson et al. | 430/321 |
|---|---|---|---|---|
| 6,369,417 | B1 * | 4/2002 | Lee | 257/294 |
| 6,379,992 | B2 * | 4/2002 | Jo | 438/70 |
| 7,279,354 | B2 * | 10/2007 | Hwang | 438/70 |
| 7,713,777 | B2 * | 5/2010 | Ryu | 438/70 |
| 2006/0023313 | A1 * | 2/2006 | Kim | 359/620 |
| 2007/0161147 | A1 * | 7/2007 | Kim | 438/70 |

FOREIGN PATENT DOCUMENTS

| JP | 10173159 A | * | 6/1998 |
|---|---|---|---|
| KR | 10-2005-0057968 | | 6/2005 |
| KR | 10-2006-0010879 | | 2/2006 |
| KR | 10-2006-0091518 | | 8/2006 |
| KR | 10-2007-0069361 | | 7/2007 |

* cited by examiner

*Primary Examiner* — Kenneth Parker
*Assistant Examiner* — Jose R Diaz
(74) *Attorney, Agent, or Firm* — Saliwanchik, Lloyd & Eisenschenk

(57) ABSTRACT

An image sensor and a method for manufacturing the same are disclosed. The image sensor can include a passivation layer on a substrate having a pad area and a pixel area, a color filter layer on the passivation layer over the pixel area, a first low temperature oxide layer on the substrate including the color filter layer, and a low temperature oxide layer microlens on the first low temperature oxide layer. The low temperature oxide layer microlens can include a seed microlens and a second low temperature oxide layer on the seed microlens. The seed microlens can be formed from the first low temperature oxide layer.

11 Claims, 4 Drawing Sheets

IMAGE SENSOR AND METHOD FOR MANUFACTURING THE SAME

CROSS-REFERENCE TO RELATED APPLICATION

The present application claims the benefit under 35 U.S.C. §119 of Korean Patent Application No. 10-2007-0062014, filed Jun. 25, 2007, which is hereby incorporated by reference in its entirety.

BACKGROUND

In general, technology for forming a microlens of an image sensor aims at maximally guiding external incident light toward a photodiode. To this end, a typical microlens is generally manufactured through a photo process using an organic-based material.

However, in a related art microlens manufacturing process, the microlens can be contaminated by particles during a wafer sawing process. Also, a pad on the image sensor may also deteriorate when the microlens is formed, leading to a decreased product yield.

Additionally, in a related art microlens manufacturing process, a zero gap is optimal in order to minimize loss of light transferred to the pixels. However, existing organic microlenses are unable to achieve the zero gap.

Furthermore, in a related art microlens manufacturing process, a polymer-based planarizing layer is typically used in order to remove any step difference generated during the formation of a color filter. However, the use of the planarizing layer causes the thickness of the image sensor to increase, which can deteriorate the image properties.

Thus, there exists a need in the art for an improved image sensor and method of manufacturing the same.

BRIEF SUMMARY

Embodiments of the present invention provide an image sensor employing a microlens using an oxide film, and a method for manufacturing the same.

Embodiments of the present invention also provide an image sensor that does not need to use a polymer-based planarizing layer, and a method for manufacturing the same.

Additionally, embodiments of the present invention provide an image sensor capable of minimizing the gap between microlenses, and a method for manufacturing the same.

In one embodiment, an image sensor can include: a passivation layer on a substrate having a pad area and a pixel area; a color filter layer on the passivation layer over the pixel area; a first low temperature oxide layer on the substrate including the color filter layer; and a low temperature oxide layer microlens on the first low temperature oxide layer over the pixel area. In a further embodiment, the low temperature oxide layer microlens can include a seed microlens on the first low temperature oxide layer over the pixel area and a second low temperature oxide layer on the seed microlens.

In another embodiment, a method for manufacturing an image sensor can include: forming a passivation layer on a substrate including a pad area and a pixel area; forming a color filter layer on the passivation layer over the pixel area; forming a first low temperature oxide layer on the substrate including the color filter layer; planarizing the first low temperature oxide layer; and forming a low temperature oxide layer microlens on the first low temperature oxide layer. The microlens can include a seed layer formed from the first low temperature oxide layer.

DETAILED DESCRIPTION

Hereinafter, an image sensor and a method for manufacturing the same according to embodiment of the present invention will be described with reference to accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1:
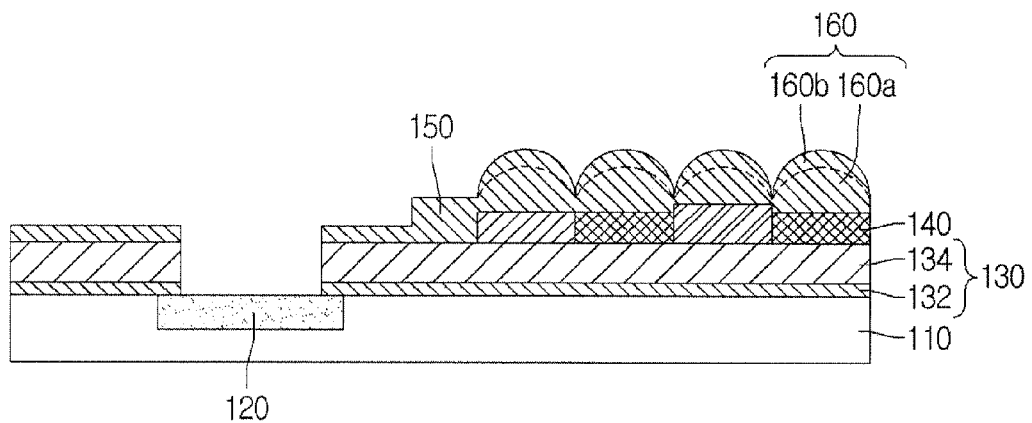
FIG. 1 is a cross-sectional view of an image sensor according to an embodiment of the present invention.

FIG. 1 is a cross-sectional view of an image sensor according to an embodiment of the present invention.

Referring to FIG. 1, an image sensor according to an embodiment of the present invention can include a passivation layer 130 on a substrate 110 having a pad area 120 and a pixel area. In addition, although not illustrated in the figures, persons of ordinary skill in the art will appreciate that the substrate 110 can include structures such as metal interconnects, interlayer dielectric layers, transistors, diffusion regions, and so forth. The image sensor can also include a color filter layer 140 on the passivation layer 130 over the pixel area, a first low temperature oxide layer 150 on the substrate 110 including on the color filter layer 140, and a low temperature oxide layer microlens 160 on the first low temperature oxide layer 150 over the pixel area. The low temperature oxide layer microlens 160 can include a seed microlens 160a and a second low temperature oxide layer 160b on the seed microlens 160a.

In one embodiment, the seed microlens 160a can have a thickness of about 2,000 Å to about 6,000 Å.

In a certain embodiment, the first low temperature oxide layer 150 can comprise the same material as the seed microlens 160a. Additionally, the seed microlens 160a can comprise the same material as the second low temperature oxide layer 160b. In one embodiment, the first low temperature oxide layer 150, the seed microlens 160a, and the second low temperature oxide layer 160b can all comprise the same material.

The passivation layer 130 can include an oxide film 132 and a nitride film 134.

The image sensor according to embodiments of the present invention does not include a polymer-based planarizing layer. This allows the thickness of the image sensor to be decreased, thereby reducing photon loss.

Additionally, embodiments of the present invention can provide a gapless microlens using an oxide film, which can also help reduce photon loss. The use of an oxide film in forming the microlens can also help decrease defects in a packaging or bumping process.

Moreover, an image sensor of the present invention can provide a continuous type microlens, so that approximately the same focal length can be formed in all directions.

Hereinafter, a method for manufacturing an image sensor according to an embodiment of the present invention will be described.

FIGS. 2 to 7 are cross-sectional views illustrating a method for manufacturing an image sensor according to embodiments of the present invention.

Figure 2:
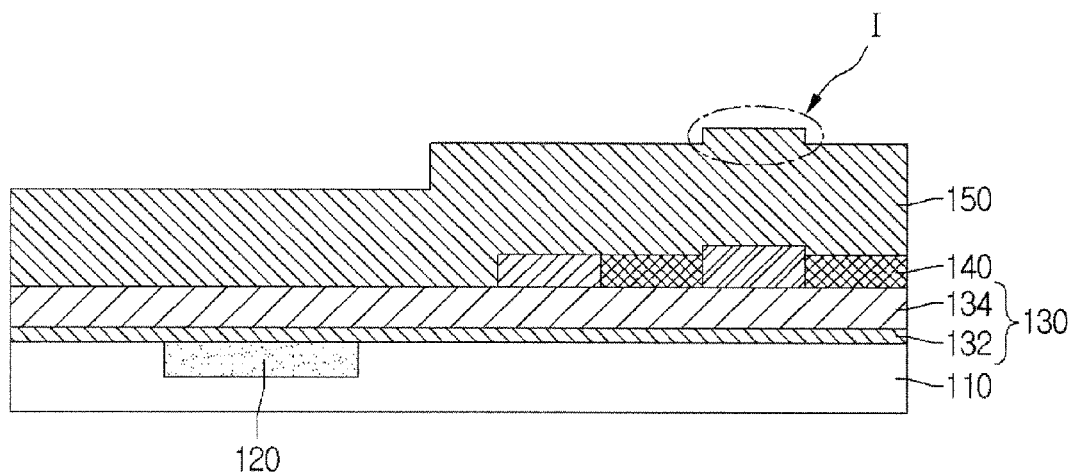
FIGS. 2 to 7 are cross-sectional views illustrating a method for manufacturing an image sensor according to an embodiment of the present invention.

Referring to FIG. 2, a passivation layer 130 can be formed on a substrate 110 having a pad area 120 and a pixel area. The passivation layer 130 can be formed of any suitable material known in the art and can have any suitable thickness known in the art.

In an embodiment, the passivation layer 130 can include an oxide film 132 and a nitride film 134 deposited on the oxide film 132. For example, the oxide film 132 can be formed of tetraethylorthosilicate (TEOS) and can have a thickness of from about 1,000 Å to about 5,000 Å. The nitride film 134 can have a thickness of about 1,000 Å to about 10,000 Å.

Then, a color filter layer 140 can be formed on the passivation layer 130. The color filter layer 140 can be formed by any suitable process known in the art. For example, a dyeable resist can be coated on the passivation layer 130, and then an exposure and development process can be performed with respect to the dyeable resist to form the color filter layer 140. The color filter layer 140 can be an RGB (red, green, and blue) color filter layer which filters light according to wavelength.

A first low temperature oxide layer 150 can be formed on the color filter layer 140. Advantageously, it is not necessary to coat polymer-based planarizing material to remove a step difference of the color filter layer 140.

In one embodiment, the first low temperature oxide layer 150 can be formed by depositing an oxide film at a temperature of less than about 200° C. For example, the first low temperature oxide layer 150 can be formed by depositing an oxide film at a temperature of about 180° C. Of course, embodiments are not limited thereto.

The first low temperature oxide layer 150 can include any suitable material known in the art and can be formed by any suitable process known in the art. For example, the first low temperature oxide layer 150 can include silicon dioxide ($SiO_2$). Additionally, the first low temperature oxide layer 150 can be formed by, for example, chemical vapor deposition (CVD), physical vapor deposition (PVD) or plasma-enhanced chemical vapor deposition (PECVD).

In certain embodiments, an irregularity may exist on the first low temperature oxide layer 150, such as irregularity I due to a step difference of the color filter layer 140.

Figure 3:
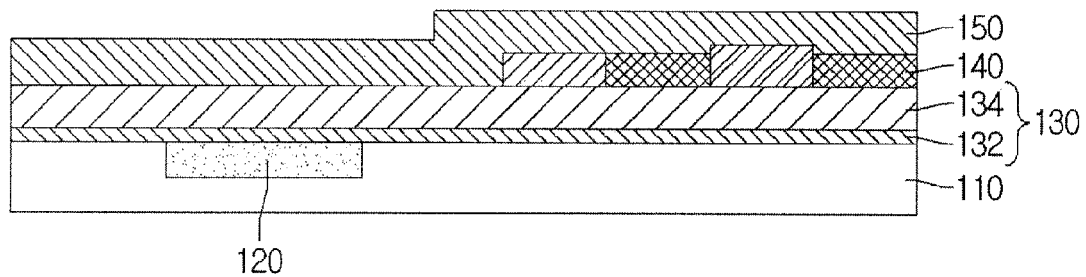

Referring to FIG. 3, the first low temperature oxide layer 150 can be planarized.

Any suitable method known in the art can be used for planarizing the first low temperature oxide layer 150.

In one embodiment, the first low temperature oxide layer 150 can be planarized by chemical dry etching. In a specific embodiment, the chemical dry etching can use $C_xF_y$ gas (where x and y are nonnegative integers). For example, the chemical dry etching can use $CF_4$ gas. In an alternative embodiment, the chemical dry etching can form plasma by using microwaves at a pressure of several hundreds of mTorr.

In another embodiment, the first low temperature oxide layer 150 can be planarized by plasma etching. For example, the plasma etching can be isotropic etching in which a capacitively coupled plasma (CCP) type source power can be applied. In a specific embodiment, the plasma etching can include a plasma etcher, using CCP type source power and bias power, which can apply the source power at a level about 10 Watts (W) to about 950 W to enhance isotropic characteristics. The plasma etching can also use $C_xF_y$-based gas (where x and y are integers) within a pressure range of several hundreds of mTorr.

Figure 4:
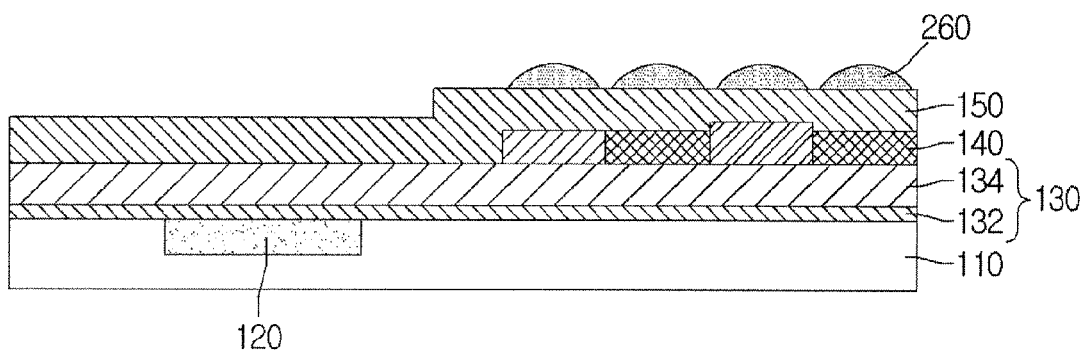

Next, referring to FIG. 4, an organic microlens pattern 260 can be formed on the first low temperature oxide layer 150 over the pixel area.

The organic microlens pattern 260 can be formed using any suitable method known in the art. For example, an organic photoresist pattern (not shown) can be formed on the first low temperature oxide layer 150, and the substrate 110 having the organic photoresist pattern can be placed on a hot plate (not shown) and heated at a temperature of about 150° C. or greater. This can cause the organic photoresist pattern to re flow, thereby y forming the organic microlens pattern 260 having an approximately hemispheric shape.

Figure 5:
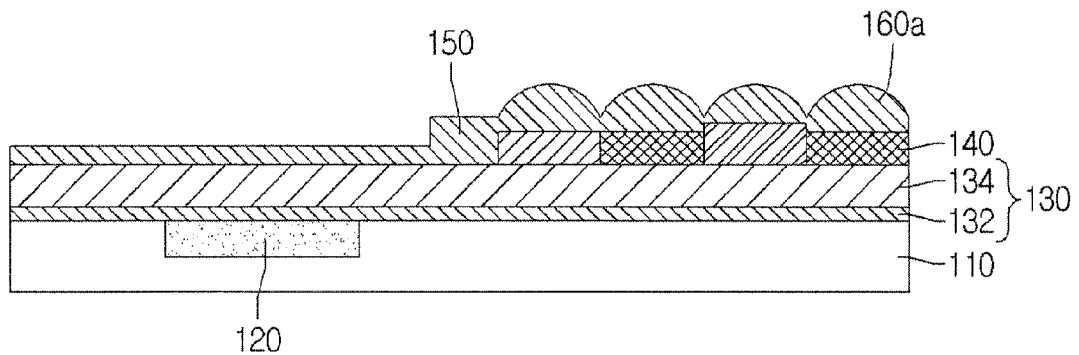

Referring to FIG. 5, the first low temperature oxide layer 150 can be selectively etched by using the organic microlens pattern 260 as an etch mask, thereby forming the seed microlens 160a over the pixel area.

In one embodiment, the seed microlens 160a can be formed over the pixel area by selectively etching the first low temperature oxide layer 150 under an atmosphere of about 40 standard cubic centimeters (sccm) to about 120 sccm of $CF_4$ and about 2 sccm to about 20 sccm of $O_2$.

In another embodiment, the seed microlens 160a can be formed by etching the first low temperature oxide layer 150 by about 1,000 Å to about 19,000 Å by using $C_xH_yF_z$ (where x, y, and z are nonnegative integers, i.e. 0, 1, 2, etc.) etching gas and atoms or molecules of $O_2$ or an inert gas, such as Ar, He, and/or $N_2$.

In certain embodiments, the etching selectivity of the organic microlens pattern 260 and the first low temperature oxide layer 150 can be from about 1:0.7 to about 1:1.3. That is, the etching selectivity of the first low temperature oxide layer 150 and the organic microlens pattern 260 can have a margin of about ±30% compared to 1:1.

In one embodiment, the seed microlens 160a can have a thickness of about 2,000 Å to about 6,000 Å.

Figure 6:
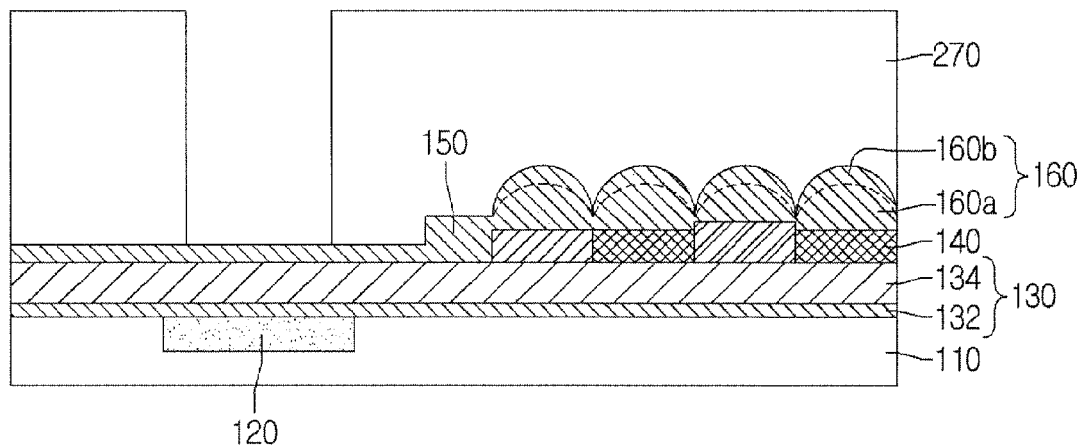

Referring to FIG. 6, the second low temperature oxide layer 160b can be formed on the seed microlens 160a over the pixel area, thereby completing fabrication of the low temperature oxide layer microlens 160.

In an embodiment, the second low temperature oxide layer 160b can have a thickness of about 500 Å to about 20,000 Å.

According to embodiments of the present invention, a gap-less microlens can be formed. The second low temperature oxide layer 160b can be used to reduce any gaps remaining between the seed microlens 160a.

In further embodiments, a pad mask pattern 270 for opening the pad area 120 can be formed. For example, the pad mask pattern 270 can be formed to expose the first low temperature oxide layer 150 over the pad area 120.

Figure 7:
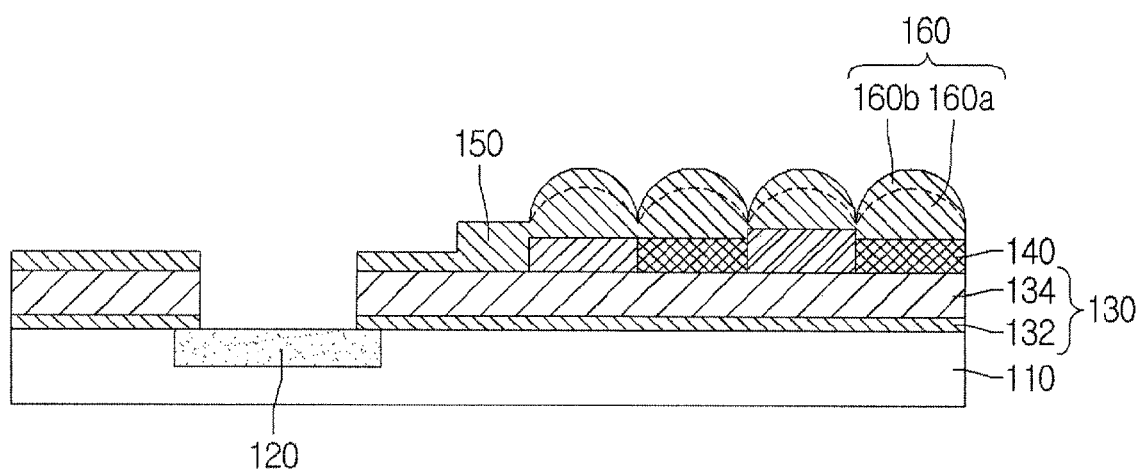

Referring to FIG. 7, the exposed first low temperature oxide layer 150 can be selectively etched by using the pad mask pattern 270 as an etching mask, thereby exposing the pad area 120. In one embodiment, the low temperature oxide layer 150 can be selectively etched under an atmosphere of about 40 standard cubic centimeters (sccm) to about 120 sccm of $CF_4$ and about 2 sccm to about 20 sccm of $O_2$. In another embodiment, the low temperature oxide layer 150 can be selectively etched using $C_xH_yF_z$ (where x, y, and z are nonnegative integers, i.e. 0, 1, 2, etc.) etching gas and atoms or molecules of $O_2$ or an inert gas, such as Ar, He, and/or $N_2$.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a passivation layer on a substrate having a pad area and a pixel area;
    forming a color filter layer on the passivation layer;
    forming a first low temperature oxide layer on the substrate including the color filter layer;
    planarizing the first low temperature oxide layer;
    forming an organic microlens pattern having an approximately hemispheric shape on the first low temperature oxide layer over the pixel area;
    selectively etching the first low temperature oxide layer by using the organic microlens pattern as an etching mask to form a seed microlens over the pixel area; and
    forming a second low temperature oxide layer on the seed microlens to form a gapless microlens including the seed microlens and the second low temperature oxide layer.

2. The method according to claim 1, wherein the seed microlens has a thickness of about 2,000 Å to about 6,000 Å.

3. The method according to claim 1, wherein the second low temperature oxide layer has a thickness of about 500 Å to about 20,000 Å.

4. The method according to claim 1, wherein forming the seed microlens comprises selectively etching the first low temperature oxide layer under an atmosphere of about 40 standard cubic centimeters (sccm) to about 120 sccm of $CF_4$ and about 2 sccm to about 20 sccm of $O_2$.

5. The method according to claim 1, wherein etching selectivity of the organic microlens pattern and the first low temperature oxide layer is from about 1:0.7 to about 1:1.3.

6. The method according to claim 1, wherein forming the organic microlens pattern comprises:
    forming an organic photoresist pattern on the first low temperature oxide layer; and
    reflowing the organic photoresist pattern to form the organic microlens pattern.

7. The method according to claim 1, wherein planarizing the first low temperature oxide layer comprises chemical dry etching.

8. The method according to claim 7, wherein the chemical dry etching uses $C_xF_y$ gas, wherein x and y are nonnegative integers.

9. The method according to claim 1, wherein planarizing the first low temperature oxide layer comprises plasma etching.

10. The method according to claim 9, wherein the plasma etching is isotropic etching in which capacitively coupled plasma type source power is applied.

11. The method according to claim 1, wherein forming the first low temperature oxide layer on the substrate including the color filter layer comprises depositing an oxide film on the substrate including the color filter layer at a temperature of less than about 200° C.

* * * * *